United States Patent

[11] 3,573,568

[72] Inventor Harvey V. Siegel
Mayfield Heights, Ohio

[21] Appl. No. 834,338
[22] Filed June 18, 1969
[45] Patented Apr. 6, 1971
[73] Assignee General Electric Company

[54] LIGHT EMITTING SEMICONDUCTOR CHIPS MOUNTED IN A SLOTTED SUBSTRATE FORMING A DISPLAY APPARATUS

4 Claims, 5 Drawing Figs.

[52] U.S. Cl. .......... 317/234, 313/108, 313/109.5
[51] Int. Cl. .......... H01l 15/00
[50] Field of Search .......... 307/235.27; 313/108 (D), 108 (B), 109.5, 235/47

[56] References Cited

UNITED STATES PATENTS

| | | | |
|---|---|---|---|
| 3,327,153 | 6/1967 | Bickmire et al. .......... | 313/109.5 |
| 3,231,776 | 1/1966 | Britnell et al. .......... | 313/109.5 |
| 3,284,722 | 11/1966 | Gray .......... | 331/94.5 |
| 3,413,603 | 11/1968 | Kimura et al. .......... | 340/146.3 |
| 3,308,452 | 3/1967 | Michel et al. .......... | 340/324 |
| 3,354,342 | 11/1967 | Ohntrup et al. .......... | 313/108 |

OTHER REFERENCES

Klein etal, R.C.A. Technical Notes, April 1968, Mononlithie Integrated Alphanumeric Display

*Primary Examiner*—John W. Huckert
*Assistant Examiner*—Martin H. Edlow
*Attorneys*—Ernest W. Legree, Henry P. Truesdell, Frank L. Neuhauser, Oscar B. Waddell and Melvin M. Goldenberg

ABSTRACT: An insulating substrate has slots in its face corresponding to the visual display pattern in which light-emitting chips consisting of solid-state PN junctions are mounted. The chips have ohmic contacts to the P and N-type material on opposite sides which are connected by brazing or soldering to metallized portions on opposite sides of the slots. External electrical connections are made through current feed pins passing through the substrate and connected to the metallized portions. The chips emit edgewise a bright pattern easily visible under room illumination levels.

Inventor:
Harvey V. Siegel
by [signature]
His Attorney

LIGHT EMITTING SEMICONDUCTOR CHIPS MOUNTED IN A SLOTTED SUBSTRATE FORMING A DISPLAY APPARATUS

CROSS REFERENCES TO RELATED APPLICATIONS

Copending Ser. No. 685,447, filed Nov. 24, 1967 by John M. Blank and Ralph M. Potter, "Silicon Carbide Light-Emitting Diode," similarly assigned.

Copending Ser. No. 716,897, filed Mar. 28, 1968, by Ralph M. Potter and Simeon V. Galginaitis, "Light-Emitting Phosphor-Diode Combination," similarly assigned.

BACKGROUND OF THE INVENTION

The invention relates to solid-state subminiature display apparatus utilizing light-emitting junctions in solid-state or semiconductor materials such as silicon carbide, gallium arsenide or gallium phosphide. A light-emitting diode of silicon carbide comprises a junction between N-type material which may be nitrogen doped and P-type material which may be boron and/or aluminum doped. Upon the application of a forward potential across the junction, light is generated by the recombination of charge carriers in close proximity to the junction.

Solid-state visual display apparatus may be used for displaying symbols including alphabet letters, numerals and symbols of various kinds. Examples of applications are card and tape readers, position indicators, optical illuminators, segmented readouts, bar graph displays and film markers. Solid-state readout devices are particularly useful as output display devices for use with electronic computer apparatus.

The object of the invention is to provide a display device such as a numeric or alpha numeric wherein information is conveyed by glowing lines of light individually controlled and sufficiently bright to be easily read in daytime levels of illumination. A device is desired having the usual advantages of solid-state materials, namely compactness and reliability, and capable of mass production by relatively unskilled personnel.

SUMMARY OF THE INVENTION

The invention provides a solid-state display or readout device comprising a plurality of line source solid-state lamps mounted in slots in the viewing face of an insulating substrate according to a selected pattern such as a numeric or an alpha numeric. The line lamps are PN junction-containing crystal chips mounted for edgewise viewing, that is with the junctions normal to the plane of the substrate face. When a junction is thus viewed in depth, a narrow line of light is seen which may be as much as 10 times brighter than the face of the junction and this achieves maximum legibility of the symbols or characters. The chips have surfaces providing ohmic contacts to the P and N-type material on opposite sides and the substrate has metallized portions on opposite sides of the slots in which the chips are inserted. The chips are permanently mounted in place by brazing or soldering of the chip contact surfaces to the metallized portions of the substrate. External electrical connections to the device may be made through current feed-pins extending through the substrate and engaging the metallized portions on the viewing face.

DETAILED DESCRIPTION

Figure 1:
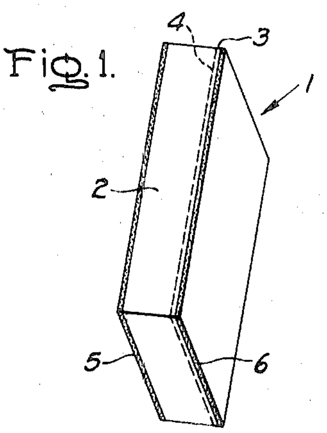
FIG. 1 is a pictorial view, greatly exaggerated in size, of a line source solid-state crystal chip.

Referring to FIG. 1, a suitable line source comprises a crystal chip 1 which has been cut from a wafer of silicon carbide which is N-type in the bulk 2 by reason of nitrogen doping. P-type dopants, suitably boron and aluminum, are diffused into the material to produce a P-type region 3 next to one face up to a junction indicated by the dotted line 4. The P-type dopants are preferably diffused into the crystal in the manner described in the aforementioned Blank and Potter application. In that process, diffusion creates P-type surface layers, typically 0.1 to 10 microns thick, on both sides of the platelet. The P-type layer is then ground off one side of the platelet to expose the original N-type bulk material on that side. Several line chips such as shown may be cut from a single platelet by using a diamond saw. By way of example, a line source lamp sold by applicant's assignee and designated SSL-11 utilizes silicon carbide chips 0.075 inches × 0.025 inches × 0.01 inches in sizes which are suitable for the present numeric readout.

The chips may be provided with ohmic contact surfaces 5 and 6 on opposite sides either before or after sawing off from the platelet. It is generally more convenient and economical to apply the contact layers before breaking off the chips. Suitably the platelet containing the PN junction is placed in a bell jar and vacuum is drawn down to about $10^{17}$ torr. Thereafter in sequence, nickel, titanium and gold are evaporated onto the exposed side of the silicon carbide platelet which is at ambient temperature. Vacuum is then broken and the crystal turned over. Vacuum is again pulled down to $10^{17}$ torr and nickel, titanium and gold are again evaporated in sequence onto the crystal at room temperature. Vacuum is then broken, the crystal removed and the chips broken off. The chips are then fired in a neutral atmosphere such as argon at 1,400° C. and this assures an ohmic contact between the evaporated metal layers and the N and P sides of the crystals on opposite faces. The viewing edge of the crystal may be polished if desired, but I have found it preferable to use them as cut by the diamond saw because the "as cut" edges diffuse light more readily and give a greater viewing angle with improved visibility of the readout device.

Figure 2:
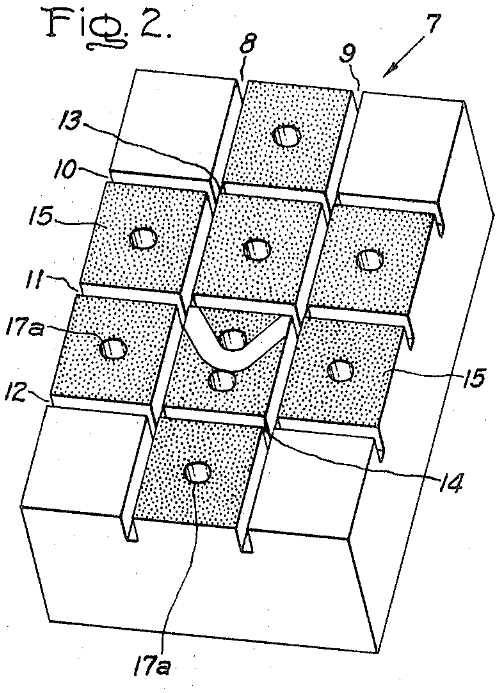
FIG. 2 is a pictorial view, also exaggerated in size, of a ceramic substrate block for a numeric readout, slotted and metallized to accommodate the line chips.
Figure 3:
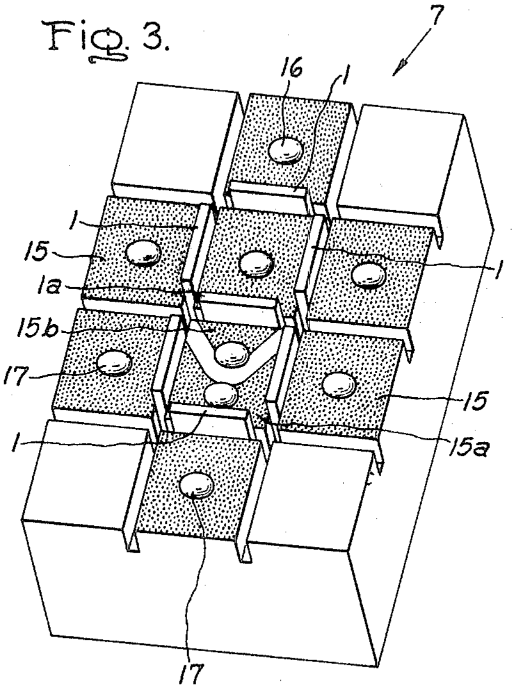
FIG. 3 is a pictorial view of the completed numeric readout device.

Referring to FIGS. 2 and 3, a block or substrate 7 of insulating material, suitably alumina ceramic, has slots cut in one face, two slots 8, 9 extending lengthwise, and three slots 10, 11 and 12 extending crosswise. The intersecting slots define two central squares 13, 14 around which the numeric pattern is formed. These two squares and also the six adjoining ones are metallized at the surface, suitably with a layer 15 of molymanganese with a gold overlay. The disposition of the metallized surfaces is such as to engage opposite sides of the crystal chips which are inserted into the slots.

Figure 4:
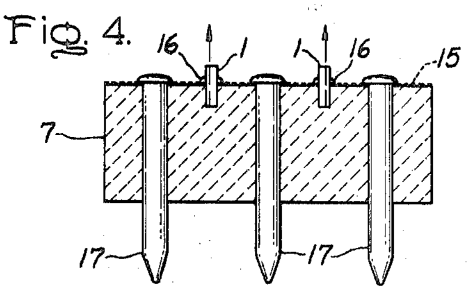
FIG. 4 is a cross section through the device of FIG. 3.

Referring to FIG. 3, the line chips 1 are shown inserted in the slots. They are permanently fastened in place by soldering or brazing using gold-tin eutectic solder. Suitably solder balls of 5 to 10 mils diameter are placed by each line chip surface and the device is then fired at a temperature from 400° to 500° C. in hydrogen. The gold-tin balls melt, wet the chip contact surfaces and the adjacent metallized surfaces of the block forming fillets 16 (FIG. 4) thereat, and upon fusing a permanent connection results. Central square 14 has its metallized layer divided into two portions 15*a* and 15*b*; metallized portion 15*b*provides a separate connection for control of central cross chip 1*a* of the numeric.

External electrical connections to the line chips may be made through terminal pins 17 (FIGS. 3 and 4) which pass through holes 17*a* (FIG. 2) in the block. The pins are staked at their upper ends to the metallized surfaces 15. The projecting pointed ends of the terminal pins may be engaged in a conventional female connector block (not shown). The readout device provides an illuminated numeral about 0.2 inch × 0.1 inch in size.

Figure 5:
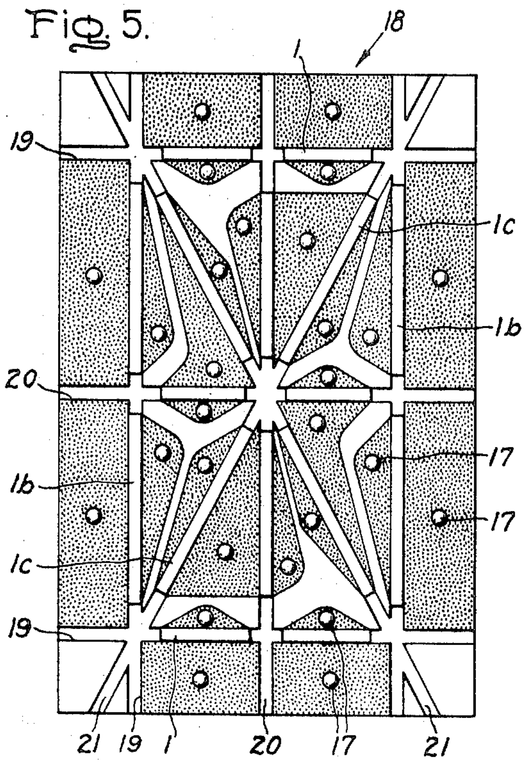
FIG. 5 is a plan view of an alpha numeric readout device embodying the invention.

FIG. 5 is a plan view of an alpha numeric readout 18 embodying the invention. In order to be able to produce all the letters of the alphabet and all numerals, each half segment of a framing 19, cross 20 or diagonal line 21 must be separately controllable. To have individual electrical connections to each segment, the face of the ceramic block may first be metallized in the pattern illustrated. Terminal pins 17 pass through the block and give connections to each metallized segment. Line source crystal chips in three different lengths 1, 1*b* and 1*c* are used; they are mounted in slots cut in the face of the substrate and soldered to the segments in the same fashion as previously described.

The line source lamps or chips may be of other radiation-emitting semiconductor materials than silicon carbide. Gallium phosphide may be used to provide a readout device which lights up red. Gallium arsenide may be used to provide a readout device which emits in the infrared and which would be visible only under special circumstances. In the case of a gallium arsenide readout device, the whole face may be coated over with a stepwise excited phosphor responsive to the infrared radiation and providing a visible output. Examples of such phosphors are fluorides of lanthanum, gadolinium, or yttrium sensitized by ytterbium and activated by erbium or thulium, such phosphor suitably being dispersed in a plastic such as polystyrene which is coated over the face of the readout device. For further details on such phosphor diode combinations, reference may be made to the aforementioned Potter and Galginaitis application.

I claim:

1. A solid-state display device comprising a block of insulating material, grooves formed in the face of said block according to a display pattern for accommodating line source PN junction-containing crystal chips, metallized portions on opposite sides of said slots insulated from each other, ohmic contacts on opposite sides of said line chips, said chips being inserted in said slots and mounted in place by solder or brazing material extending between the contact surfaces of the chips and the metallized portions of the substrate.

2. A device as in claim 1 wherein the line source crystal chips are edgewise mounted in the slots with the junctions normal to the face of the block.

3. A device as in claim 1 wherein the line sources are silicon carbide crystal chips edgewise mounted in the slots with the junctions normal to the face of the block.

4. A device as in claim 1 wherein the line sources are gallium arsenide crystal chips and the device is coated over with stepwise excited phosphor responsive to the infrared radiation of gallium arsenide to provide a visible output.